VOLTAGE CONTROLLED VARIABLE FREQUENCY RELAXATION OSCILLATOR

Filed Oct. 26, 1966

United States Patent Office 3,427,562
Patented Feb. 11, 1969

3,427,562

VOLTAGE CONTROLLED VARIABLE FREQUENCY RELAXATION OSCILLATOR

Peter A. Lajoie and Samuel S. Harbaugh, Natrona Heights, Pa., assignors to Allegheny Ludlum Steel Corporation, Brackenridge, Pa., a corporation of Pennsylvania Filed Oct. 26, 1966, Ser. No. 589,707
U.S. Cl. 331—111 8 Claims
Int. Cl. H03k 3/30

ABSTRACT OF THE DISCLOSURE

Described is a direct current voltage to frequency converter employing a field effect transistor which enables the circuit to respond to both positive and negative input voltages. This converter may be coupled to a power switch to provide output pulses which can be integrated to provide an output voltage proportional to the input voltage.

Voltage to frequency converters have wide application in situations wherein it is desired to provide a pulse output at a rate which is a predictable function of the value of the voltage level input signal. Such converters find application in the computer field and in general control systems. Prior art converters of this type have been complex in nature and have experienced difficulty in maintaining a reliable zero frequency.

It is accordingly an object of this invention to provide a new and improved voltage to frequency converter.

It is another object of this invention to provide a new and improved voltage to pulse frequency converter in which the pulse rate of the output is proportional to the direct current input voltage level.

It is a further object of this invention to provide a new and improved voltage to pulse frequency converter utilizing a voltage controlled charging source for a capacitor which establishes the pulses.

It is still another object of this invention to provide a new and improved voltage to pulse frequency converter in which a predetermined charge on a capacitor renders a controllable semi-conductor device conductive to provide a pulsed output.

It is still a further object of this invention to provide a new and improved voltage to pulse frequency converter which is simple in design and economical to construct.

These and other objects of the invention are accomplished by providing a controllable semi-conductor relaxation oscillator utilizing a field effect transistor for the input as a voltage controlled charging source for the oscillation capacitor. The controllable semi-conductor device can take the form of a unijunction transistor or a four-layer breakover diode.

The above and other objects and features of the invention will become apparent from the following detailed description when taken in conjunction with the accompanying drawings which form a part of this specification and in which.

*Circuit description*

Figure 1:
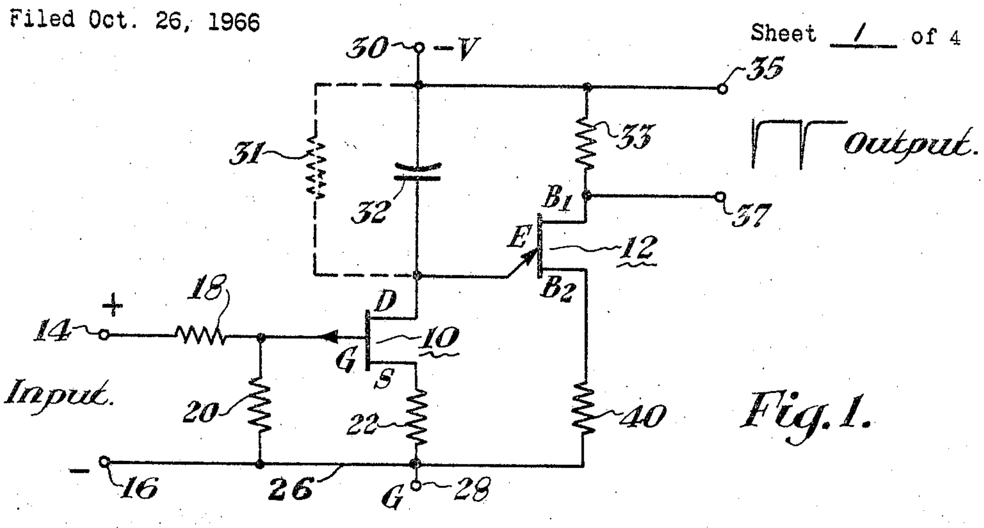
FIGURE 1 is a schematic diagram of one embodiment of the voltage to frequency converter according to the invention.
Figure 3:
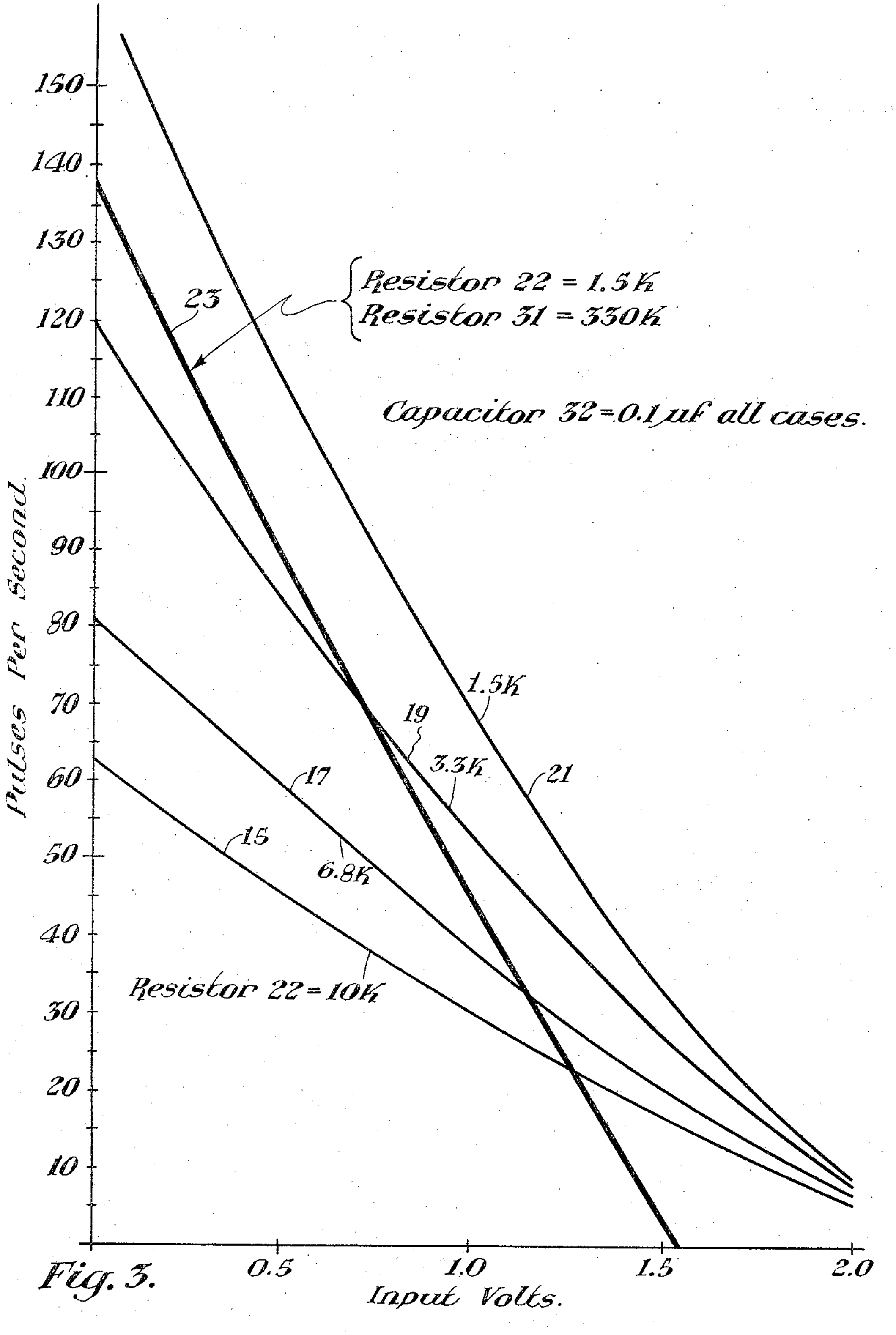
FIG. 3 is a graphical illustration of the input-output function of the voltage to pulse frequency converter of FIG. 1 and its variability with respect to certain circuit elements.

Referring now to the drawings, and particularly to FIG. 1, the circuit connections will now be described. A field effect transistor 10 has its drain terminal D connected to the emitter terminal E of unijunction transistor 12. The input is provided between positive terminal 14 connected through resistor 18 to the gate terminal G of transistor 10 and negative terminal 16 connected to lead 26, while a load resistor 20 is connected between the gate terminal G and lead 26. The source terminal S of transistor 10 is connected through biasing resistor 22 to lead 26, the lead 26 also being indicated by positive (+) terminal 28 indicating the ground connection for the power supply. The transistor 10 is powered from a negative power supply terminal 30 through capacitor 32 and resistor 31 which are connected in parallel to the drain terminal D thereof. Power is also provided from negative power supply terminal 30 through load resistor 33 to the base terminal $B_1$ of unijunction transistor 12. Base terminal $B_2$ of transistor 12 is connected through resistor 40 to lead 26. Resistor 31 is shown in dotted lines, since it may be excluded without affecting the operation of the circuit. The values for resistor 31, capacitor 32 and resistor 22 are not designated, but the effect of these values is shown by the graphical illustration of FIG. 3 in which the input voltage appearing between terminals 14 and 16 is plotted with respect to the pulses per second appearing at output terminals 35 and 37 which are connected across resistor 33. In FIG. 3 the curves designated 15, 17, 19 and 21 illustrate the effect of resistor 22 on the circuit of FIG. 1 with the resistor 31 removed from the circuit, while the curve 23 shows the shifting of the curve and the substantial linearity with resistor 31 included in the circuit with the values as shown in FIG. 3.

Figure 2:
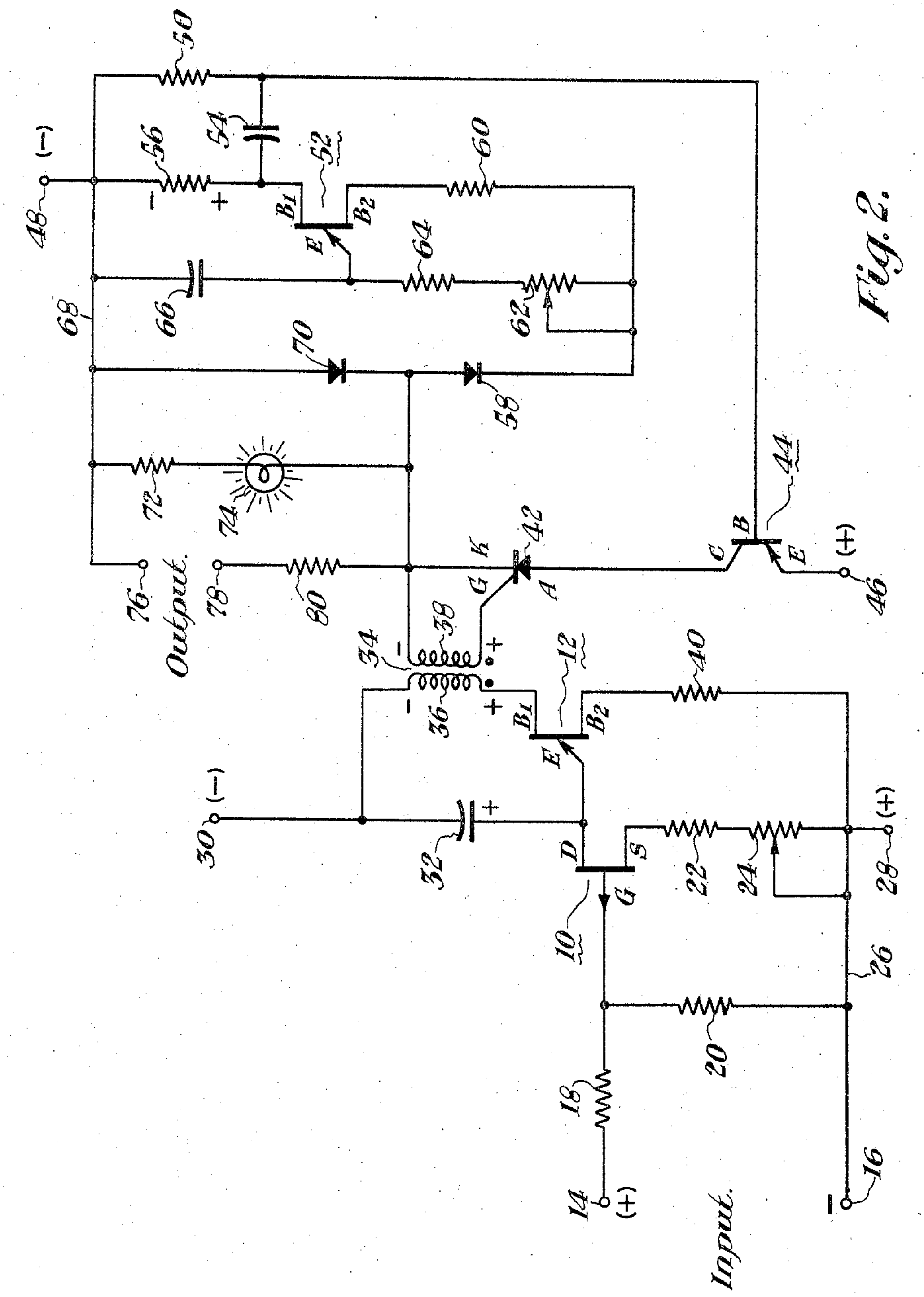
FIG. 2 is a schematic diagram of the voltage to frequency converter of FIG. 1 incorporating a power switch and time delay circuit.

The circuit of FIG. 1 is shown in FIG. 2 with the resistor 33 replaced by the primary winding 36 of a transformer 34. A variable resistor 24 has also been added in series with resistor 22. Similar components in the two figures are similarly designated.

The output pulse from the voltage to frequency converter then appears at the secondary winding 38 of transformer 34 which is connected between the gate terminal G and the cathode terminal K of silicon-controlled rectifier 42. The silicon-controlled rectifier 42 is connected in series with a PNP transistor 44 by connecting the collector terminal C thereof to the anode terminal A of silicon-controlled rectifier 42. The emitter terminal E of transistor 44 is connected to a positive (+) terminal 46, indicating a ground connection. The base terminal B of transistor 44 is connected to negative (−) power input terminal 48 through resistor 50. The base terminal B of transistor 44 is also coupled to the base $B_1$ of the unijunction transistor 52 by means of capacitor 54. The base terminal $B_1$ of transistor 52 is also connected to the negative (−) power input terminal 48 through resistor 56. A circuit is provided from the cathode terminal K of silicon-controlled rectifier 42 through a diode 58 through resistor 60 to the base terminal $B_2$ of transistor 52. The cathode of diode 58 is connected to a variable biasing resistor 62 in series with a fixed biasing resistor 64 to the emitter terminal E of transistor 52, while a capacitor 66 couples the emitter terminal E to lead 68 connected to negative power input terminal 48. A second diode 70 has its anode connected to lead 68 and its cathode connected to the anode of diode 58. In parallel with diode 70 there is a resistor 72 in series with an indicating lamp 74. The pulse output is provided at terminals 76 and 78, terminal 76 being connected to lead 68 and terminal 78 being connected to current limiting resistor 80 to cathode terminal K of silicon-controlled rectifier 42.

*Circuit operation (FIGS. 1 and 2)*

Referring to the circuit in FIG. 1, the input voltage signal is applied at input terminals 14 and 16 across load resistor 20. The field effect transistor 10 controls the charging path for the capacitor 32. The P-channel field effect transistor 10 has a high input impedance and has characteristics for applications of positive voltages to the gate terminal G up to its cut-off or pinch-off voltage $V_p$. Thus, by utilizing a field effect transistor, a reliable zero frequency can easily be obtained because complete current cut-off can be accomplished without the necessity of the input voltage going to zero or changing polarity. The transistor 10 gate is reverse biased by the input voltage to provide these characteristics. The input signal is transmitted through transistor 10 to begin charging the capacitor 32. The emitter to base $B_1$ of the unijunction transistor 12 acts as an open circuit until the charge on capacitor 32 equals or exceeds a certain value which is a function of the intrinsic stand-off ratio and the supply voltage for the unijunction transistor 12. The emitter to base $B_1$ of the transistor 12 then acts as a short circuit to permit the flow of current from the plus (+) side of the capacitor 32 through the emitter E to the base $B_1$ of transistor 12 through the resistor 33 with a polarity as indicated from plus (+) to minus (−). The current then continues to flow until the charge on the capacitor 32 falls to the value which turns off transistor 12, the output pulses appearing at terminals 35 and 37.

The operation of the circuit of FIG. 2 is identical, but the pulse output appears between the gate terminal G and cathode terminal K of silicon-controlled rectifier 42. A power switch is provided to be activated by the output of the relaxation oscillator. The power switch comprises the PNP transistor 44 having its collector C connected in series with the anode of the silicon-controlled rectifier 42. The transistor 44 is initially biased in its conductive or full "on" state. At this point a steady-state voltage appears across resistor 50 connected between the base terminal B of transistor 44 of the negative power input terminal 48. When current flows from plus (+) to minus (−) as indicated on primary coil 36, the current is induced in secondary winding 38 of transformer 34 which appears between the gate terminal G and the cathode terminal K of silicon-controlled rectifier 42. This induced current renders the silicon-controlled rectifier 42 conductive. A voltage then appears at output terminals 78 and 76, as long as the silicon-controlled rectifier 42 is in its conductive state. Output terminal 76 is coupled to the negative power input terminal 48 by means of lead 68, while a circuit is completed to output terminal 78 from the positive common terminal 46 through the emitter to collector junction of transistor 44 through the anode A and cathode K terminals of silicon-controlled rectifier 42 to resistor 80.

Initially the base terminal B of transistor 44 is approximately at the voltage of the emitter terminal E. When the silicon-controlled rectifier 42 conducts, a circuit is completed from cathode K of silicon-controlled rectifier 42 through diode 58 through resistors 62 and 64 to the emitter E of unijunction transistor 52. This begins to charge the capacitor 66 connected between the emitter terminal E of transistor 52 and lead 68. Transistor 52 acts as an open circuit until the charge on capacitor 66 equals or exceeds the intrinsic stand-off ratio for the transistor 52. The transistor 52 then acts as a short circuit to permit the flow of current from the plus (+) side of capacitor 66 from the emitter E to the base $B_1$ of transistor 52 to provide a voltage across resistor 56 with the polarity as shown. The capacitor 54, now having a difference of potential across its terminal, conducts for the duration of the pulse to drive the base B of transistor 44 more positive, thereby rendering transistor 44 nonconductive. At this point no output appears at terminals 76 and 78 due to the nonconduction of transistor 44. As the current ceases, the silicon-controlled rectifier 42 then returns to its nonconducting state, and with the discharge of capacitor 66 the transistor 44 returns to its conductive state. The silicon-controlled rectifier 42 then remains nonconductive until it receives another pulse induced in the secondary winding 38 of transformer 34.

Figure 4:
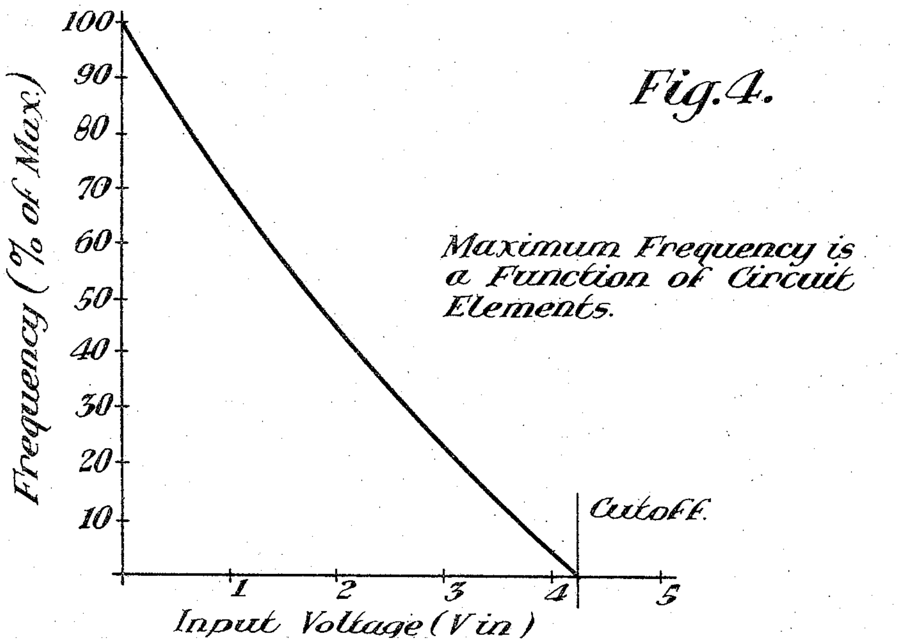
FIG. 4 is a graphical illustration of the input-output function of the circuit of FIG. 2.
Figure 6:
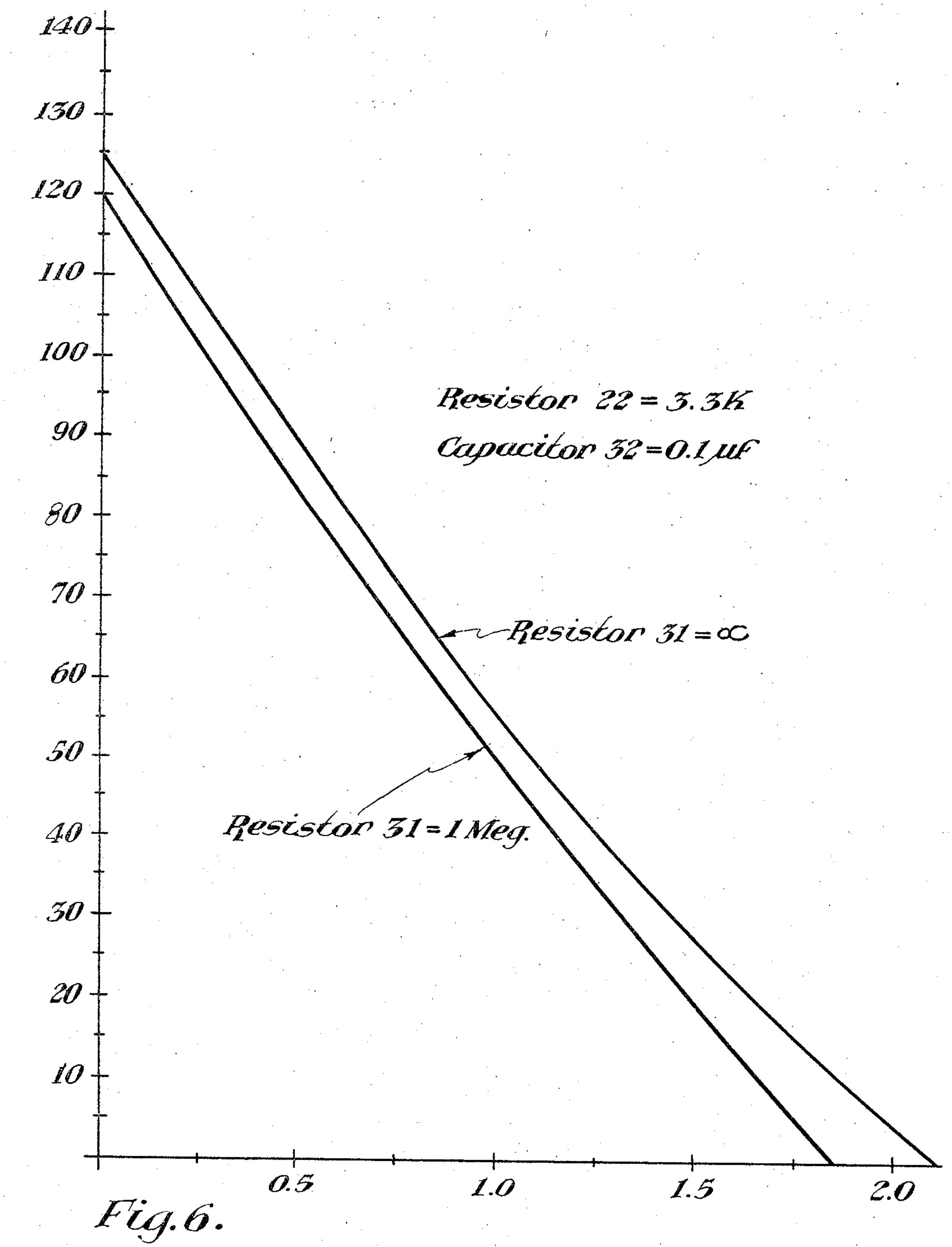
FIG. 6 is a graphical illustration of the input-output function of the circuit of FIG. 5 and shows its variability with respect to certain circuit elements.

FIG. 4 shows the approximate relationship of the input voltage to frequency for the circuits shown in FIG. 2, the input voltage being applied to terminals 14 and 16, and the output taken across terminals 76 and 78. It can be seen that the relationship is approximately linear. Using the resistor 31 in parallel with the oscillation capacitor 32 to minimize the nonlinearity of the input-output relationship decreases the voltage level at which cut-off occurs, as is illustrated in FIGS. 4 and 6. However, the input-output relationship still remains the same in that:

$$f \propto (V_m - V_{in})$$

where:
$f$=frequency
$V_{in}$=input voltage
$V_m$=cutoff level of transistor 10.

In the above relationship the frequency $f$ would be the frequency of the pulses appearing across resistor 33 or across transformer winding 36 in FIGS. 1 and 2, respectively.

Figure 5:
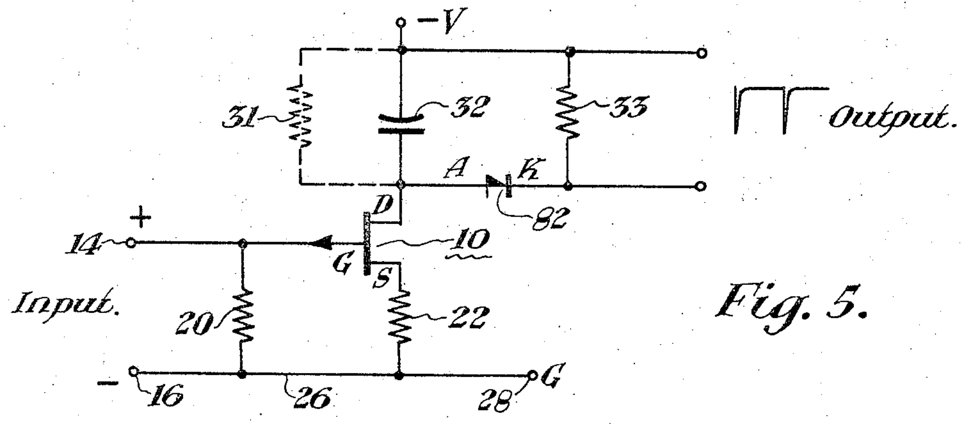
FIG. 5 is a schematic diagram of a second embodiment of the voltage to frequency converter utilizing a four-layer breakover diode.

Referring now to FIG. 5, a second embodiment of the voltage to frequency converter is shown in which a four-layer breakover diode is employed in place of a unijunction transistor. The field effect transistor 10 has its drain terminal D connected to the anode A of breakover diode 82. The input is provided from positive terminal 14 and negative terminal 16. The gate terminal G of transistor 10 is connected to the signal input terminal 14, while a load resistor 20 is connected between the gate terminal G of transistor 10 and the negative input terminal 16. The source terminal S of transistor 10 is connected through biasing resistor 22 to the common positive power supply terminal 28. The negative input terminal 16 is also connected to terminal 28 by means of lead 26. The transistor 10 is powered from a negative supply terminal 30 through capacitor 32 to the drain terminal D thereof. An optional resistor 31 can be connected in parallel with capacitor 32 as previously explained. The cathode terminal K of breakover diode 82 is connected through resistor 33 to the negative supply terminal 30 and the pulse output appears across resistor 33.

The operation of the circuit of FIG. 5 is essentially similar to the operation of the circuit of FIG. 1. The input signal is transmitted to field effect transistor 10 to control the charging rate of the capacitor 32. The breakover diode 82 acts as an open circuit until the charge on the capacitor 32 equals or exceeds a certain value known as the breakover voltage. The diode 82 then acts as a short circuit to permit the flow of current from the plus (+) side of the capacitor 32 through the breakover diode 82 through the resistor 33. The current continues to flow until the current through the breakover diode 82 falls to a value which returns breakover diode 82 to its nonconductive state. As previously discussed, the resistor 31 (shown in dotted lines) may be included to provide linearity as shown by the graph of FIG. 6 for the circuit of FIG. 5.

*Summary*

Thus it can be seen that a relatively simple voltage to pulse frequency converter is provided by utilizing a relaxation oscillator including either a unijunction transistor or a breakover diode supplied by a voltage controlled charging source including a field effect transistor. By selection of the appropriate circuit elements, a voltage to pulse frequency converter can be provided to meet the needs of a variety of applications.

While there has been shown and described specific embodiments, it is to be understood that various changes in form and arrangement of parts may be made to suit requirements without departing from the spirit and scope of the invention.

We claim:

1. In a voltage to pulse frequency converter in which the output pulse rate is proportional to the magnitude of a direct current input signal, the combination of a capacitor, means for charging said capacitor according to the magnitude of an input signal, controllable semi-conductor means in circuit relation with said capacitor to provide a discharge path for said capacitor when the charge on said capacitor exceeds a predetermined value, transformer means having a primary winding and secondary winding with the primary winding coupled to said controllable semi-conductor means, a silicon-controlled rectifier having an anode, cathode and control electrode, means connecting the opposite ends of the secondary winding of said transformer means to the cathode and control electrode of said silicon-controlled rectifier, means including a first transistor connecting the anode and cathode of said silicon-controlled rectifier to a source of energizing potential, the silicon-controlled rectifier being rendered conductive each time a pulse appears across said secondary winding upon discharge of said capacitor through said controllable semi-conductor means, and means responsive to a pulse produced across said secondary winding for cutting off said first transistor and hence said silicon-controlled rectifier after a predetermined time interval following the occurrence of the leading edge of a pulse appearing across said secondary winding.

2. The combination of claim 1 wherein the means for cutting off said first transistor includes a second capacitor which is charged upon conduction of said silicon-controlled rectifier, and means including a unijunction transistor connected in shunt with said second capacitor for cutting off said first transistor after the capacitor has charged to a predetermined voltage level.

3. The combination of claim 2 wherein said first transistor comprises a switching transistor having its emitter connected to one terminal of said source of energizing potential and its collector connected to the anode of said silicon-controlled rectifier, the base of said switching transistor being connected to the other terminal of said source of energizing potential, said second capacitor being in series with the emitter and one of the base electrode of said unijunction transistor, and a third capacitor connecting said one base electrode of the unijunction to the base of said switching transistor.

4. In the combination as recited in claim 1, wherein the means for controlling the charging of said capacitor according to the magnitude of the input signal comprises; a field effect transistor, having a drain terminal and a gate terminal, the drain terminal of said field effect transistor being connected in circuit relation with said capacitor; and input signal means for providing a direct current signal to the gate terminal of said field effect transistor, said capacitor being charged according to the magnitude of the input signal.

5. A voltage-to-pulse frequency converter in which the output pulse rate is proportional to the magnitude of a direct current signal, said converter comprising: a capacitor; a field effect transistor, having a drain terminal and a gate terminal, the drain terminal of said transistor being connected in circuit relation with said capacitor; input signal means for providing a positive direct current signal to the gate terminal of said transistor, said capacitor being charged according to the magnitude of said input signal; controllable semi-conductor means in circuit relation with said capacitor to provide a discharge path for said capacitor when the charge in said capacitor exceeds a predetermined value, said controllable semi-conductor means providing a pulse output for the time the charge exceeds the predetermined value; switch means; means responsive to the discharge of said capacitor for rendering said switch means conductive; and time delay means in circuit relation with said switch means and responsive to the initiation of conduction of said switch means for initiating a predetermined time period, said time delay means rendering said switch means nonconductive after said predetermined time period.

6. The combination as recited in claim 5 wherein said controllable semi-conductor means comprises a four-layer breakover diode.

7. The combination as recited in claim 5 wherein a resistor is connected in parallel with said capacitor to provide a substantially linear relationship between the output pulse rate and the magnitude of the input signal and said controllable semi-conductor comprises a unijunction transistor.

8. The combination as recited in claim 6 wherein a resistor is connected in parallel with said capacitor to provide a substantially linear relationship between the output pulse rate and the magnitude of the input signal.

References Cited

UNITED STATES PATENTS

| | | | |
|---|---|---|---|
| 3,060,388 | 10/1962 | Ball et al. | 331—111 X |
| 3,206,694 | 9/1965 | Bates | 331—111 X |
| 3,230,480 | 1/1966 | Prather | 331—111 X |

FOREIGN PATENTS

| | | |
|---|---|---|
| 913,757 | 12/1962 | Great Britain. |

OTHER REFERENCES

J. Schwartz: "Unijunction Transistor Simplifies Voltage-Frequency Converter," Electronics, Oct. 25, 1963, p. 56.

Cohen: "Generating Linear Waveforms With Field-Effect Transistors," Electronic Design, Jan. 4, 1963, pp. 66–69.

ROY LAKE, *Primary Examiner.*

S. H. GRIMM, *Assistant Examiner.*

U.S. Cl. X.R.

331—177